United States Patent [19]
Lairson et al.

[11] Patent Number: 5,363,794
[45] Date of Patent: Nov. 15, 1994

[54] UNIAXIAL THIN FILM STRUCTURES FORMED FROM ORIENTED BILAYERS AND MULTILAYERS

[75] Inventors: Bruce M. Lairson; Bruce M. Clemens, both of Mountain View; Mark R. Visokay, Stanford, all of Calif.

[73] Assignee: The Board of Trustees of the Leland Stanford Junior University, Stanford, Calif.

[21] Appl. No.: 984,888

[22] Filed: Dec. 2, 1992

[51] Int. Cl.$^5$ .................................................. C30B 1/10
[52] U.S. Cl. .......................................... 117/7; 117/89; 117/939
[58] Field of Search ................. 156/603, 612, DIG. 74

[56] References Cited

U.S. PATENT DOCUMENTS

| | | | |
|---|---|---|---|
| 3,607,460 | 9/1971 | Lammel | 420/462 |
| 3,755,796 | 8/1973 | Griest | 420/435 |
| 4,154,874 | 5/1979 | Howard et al. | 437/197 |
| 4,430,183 | 2/1984 | Schuller et al. | 204/192 |
| 4,438,066 | 3/1984 | Aboaf et al. | 204/192.2 |
| 4,454,495 | 6/1984 | Werner et al. | 338/195 |
| 4,935,311 | 6/1990 | Nakatani et al. | 428/611 |
| 5,062,938 | 11/1991 | Howard | 204/192.2 |
| 5,112,699 | 5/1992 | Chang | 156/612 |
| 5,158,653 | 10/1992 | Lashmore et al. | 204/192.12 |

FOREIGN PATENT DOCUMENTS 2648828  6/1989  France ....................... 14/34

OTHER PUBLICATIONS

D. Treves, J. Jacobs and E. Sawatzky, "Platinum-cobalt films for digital magneto-optic recording", Journal of Applied Physics, vol. 46, No. 6, Jun. 1975, pp. 2760–2765.

R. McCurrie and P. Gaunt, "The magnetic properties of platinum-cobalt near the equiatomic composition", Proceedings of the International Conference on MAGNETISM, Nottingham, England, Sep. 1964, pp. 780–782.

D. Weller, H. Brändle and C. Chappert, "Relationship between Kerr effect and perpendicular magnetic anisotropy in $Co_{1-x}Pt_x$ and $Co_{1-x}Pd_x$ alloys", Journal of Magnetism and Magnetic Materials 121 (1993), pp. 461–470.

C. Lee, R. Farrow, C. Lin, E. Marinero and C. Chien, "Molecular-beam-epitaxial growth and magnetic properties of Co-Pt superlattices oriented along the [001], [110], and [111] axes of Pt", Physical Review B, vol. 42, No. 17, 15 Dec. 1990-I, pp. 11385–11387.

M. Toney, R. Farrow, R. Marks, G. Harp, and T. Rabedeau, "Observation of the Ordered $CoPt_3$ Alloy in Co-Pt Multilayers", Mat. Res. Soc. Symp. Proc. vol. 263, 1992, pp. 237–242.

S. Yung, Y. Chang, T. Lin and M. Hung, "Magnetic properties and microstructure of iron-platinum thin films", Journal of Magnetism and Magnetic Materials 116 (1992), pp. 411–418.

T. Katayama, T. Sugimoto, Y. Suzuki, M. Hashimoto, P. de Haan and J. Lodder, "Magneto-optical Kerr rotation spectra in ordered and disordered phases of Fe-Pt alloy films", Journal of Magnetism and Magnetic Materials 104–107 (1992) pp. 1002–1004.

M. Watanabe, K. Takanashi and H. Fujimori, "Perpendicular magnetic anisotrophy and magneto-optical Kerr effect of FePt/Pt multilayer films", Journal of Magnetism and Magnetic Materials 113 (1991), pp. 110–114.

*Primary Examiner*—Robert Kunemund
*Attorney, Agent, or Firm*—Leo V. Novakoski; Edward J. Radlo

[57] ABSTRACT

A method for producing oriented, intermetallic, thin film structures having uniaxial magnetic, electronic, optical, and mechanical properties. Artificial superlattices (10) are assembled by sputter deposition of alternating layers of the component metals of the target intermetallic compound on an aligned substrate (16). Either single crystal substrates or crystallographically textured substrates may be used to induce alignment of the deposited layers (10, 12) in the method of the present invention. Annealing of the resulting superlattice (10) generates aligned, thin film intermetallic compounds (38) of the component metals at the interfaces (44) of the superlattice (10), the thin film intermetallic compounds having pronounced, uniaxial properties.

21 Claims, 9 Drawing Sheets

UNIAXIAL THIN FILM STRUCTURES FORMED FROM ORIENTED BILAYERS AND MULTILAYERS

DESCRIPTION

1. Technical Field

This invention pertains to the field of thin film structures, and in particular to the field of thin film structures having pronounced uniaxial magnetic, electronic, optical, and mechanical properties.

2. Background Art

It is well known in materials science that uniaxial structures typically have pronounced uniaxial physical properties as a result of their axial symmetry. For example, those bulk phase intermetallic compounds which can be grown as single crystals in a tetragonal $L1_0$ crystal structure have magnetic, electrical, optical, and mechanical properties which are axially symmetric about the [001] crystal direction, along the c-axis of the crystal.

The highly directional physical properties of uniaxial structures are particularly desirable in the design of magneto-optic memory devices. These are typically planar, disc-shaped devices having a thin film coating of magnetic material which can be magnetically modified at selected locations to store data. The use of thin film materials having strong uniaxial magnetic moments aligned perpendicular to the plane of the device allows the storage of data at higher densities and in more advantageous recording geometries. A major impediment to the realization of such high density storage devices is the difficulty of producing the uniaxial properties of bulk crystals in thin film structures.

Uniaxial $L1_0$ crystals such as tetragonal CoPt have been produced in bulk materials by strain annealing and by directional solidification of the component elements. However, neither of these methods is applicable to thin films due to the mechanical constraints imposed by the substrate. Attempts to produce oriented uniaxial structures in thin films have relied instead on various deposition techniques to either directly grow thin films of aligned uniaxial crystals or to assemble artificial superlattices by sequentially layering the constituent materials.

Oriented intermetallic thin films have been produced by means of texturing, wherein the components of a bulk uniaxial material are deposited on amorphous or polycrystalline substrates, and have some degree of alignment. In the case of tetragonal PtFe and CoPt, this method has produced thin films with out-of-plane alignments in the <111> directions and no alignment in the desired [001] direction. Epitaxial growth of PtFe and related intermetallic compounds on single crystal substrates has not provided significantly better results.

DISCLOSURE OF INVENTION

The present invention provides a method for making thin films of oriented, uniaxial ordered intermetallic compounds having uniaxial physical properties comparable to those of their bulk counterparts. The method has the added advantage of being effective with materials whose bulk structures are only weakly anisotropic.

The present invention relies on the formation of coherent precipitates of intermetallic compounds at the interfaces between layers of deposited metals to impose a stringent orientational bias on the precipitated intermetallic thin films. In the method, component materials are first deposited in alternating layers over a bulk substrate having the desired alignment, which is typically perpendicular to the plane of the deposited layers. The resulting layers constitute a superlattice structure having multiple interfaces. When the structure is annealed under proper conditions, component metals are coherently precipitated at these interfaces to form intermetallic thin films having the desired uniaxial properties.

DETAILED DESCRIPTION OF THE PREFERRED EMBODIMENTS

Figure 1A:
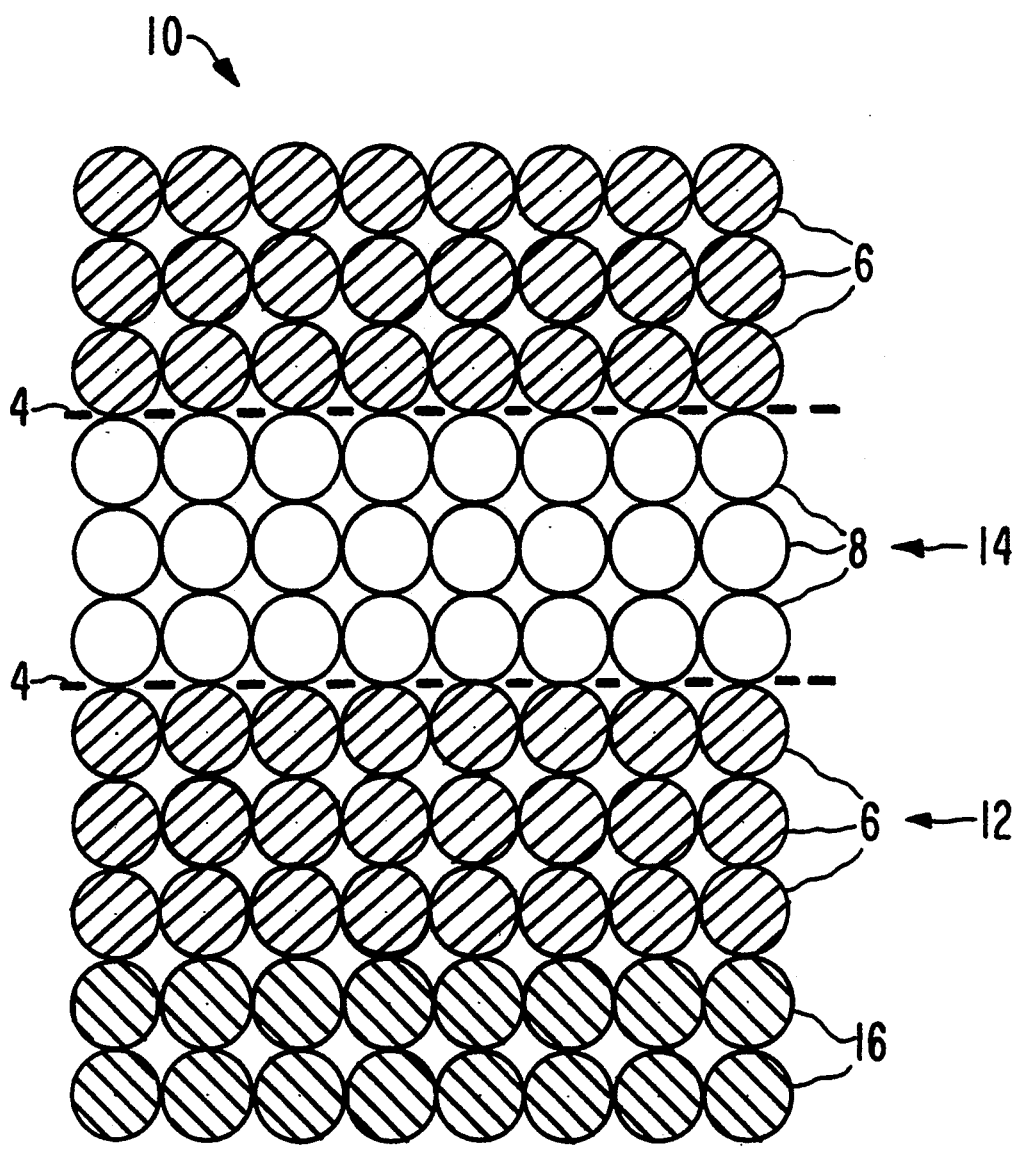
FIG. 1A is a schematic diagram of an artificial intermetallic superlattice (10).

Superlattices consist of alternating layers of two different materials with each layer typically being more than a single atomic layer thick. Referring to FIG. 1A, there is shown a superlattice 10 in which a pair of metals 6, 8 have been deposited on a substrate 16 to form epitaxially related layers 12, 14 separated by an interface 4. The orientations of metal layers 12, 14 are determined by the crystal structure of substrate 16 as well as the crystal structures of the pure metals 6, 8. Layers 12, 14 of superlattice 10 are shown having cubic crystal structures with crystal direction [001] oriented normal to layers 12, 14.

Superlattices 10 of the type shown in FIG. 1A may be assembled from metal pairs such as PtFe, PtCo, FeNi, FePd, NiPd, NiPt, PdCo, or CoNi. In addition, a superlattice 10 may be assembled by deposition methods which stack layers 12, 14 along any of the other crystal directions. For example, superlattices 10 having Pt and Co layers stacked along the [111] direction have received much attention recently due to their potential applications in magneto-optic recording media.

Although the structure shown in FIG. 1A comprises epitaxially related constituents, superlattices may also comprise layers of crystallographically textured materials or amorphous materials. In crystallographically textured superlattices, the crystal structures comprising each layer are only partially aligned. Typically, a specified crystal axis is aligned perpendicular to the plane of the superlattice layer while the remaining crystal axes are randomly oriented within the layer. One distinction between the epitaxial and crystallographically textured superlattices of the present invention is the structure of the substrates onto which the component materials are deposited. Thus, single crystal materials are employed as substrates for growing epitaxial superlattices and polycrystalline or amorphous materials are employed as substrates for growing textured superlattices.

Figure 1B:
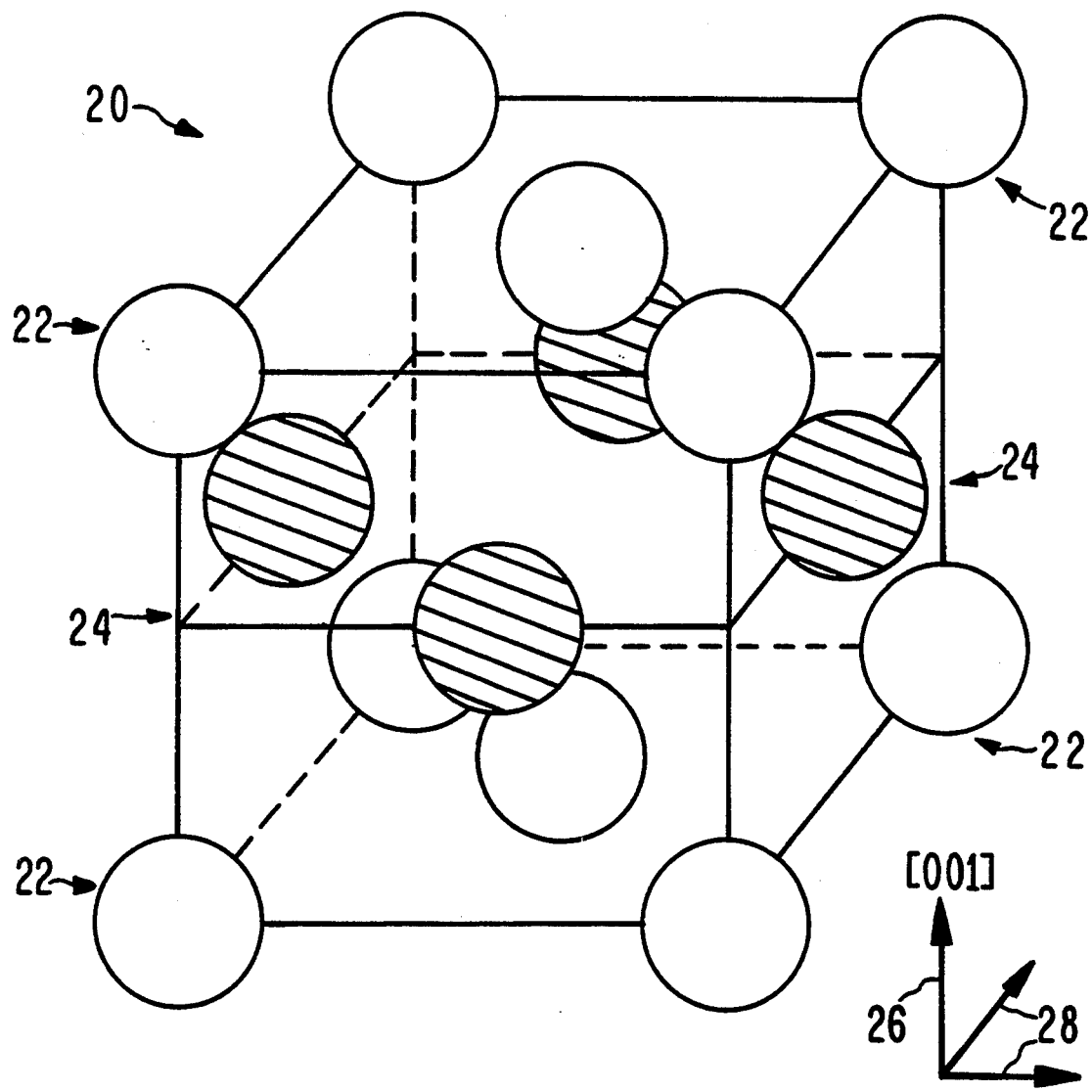
FIG. 1B is a schematic diagram of a natural intermetallic superlattice (20).

Referring now to FIG. 1B, there is shown the tetragonal $L1_0$ crystal structure 20 of certain natural intermetallic superlattices such as PtFe and PtCo. In tetragonal PtFe, Fe and Pt atoms together form a structure similar to the face centered cubic structure in which planes of Pt atoms 22 and planes of Fe atoms 24 alternate along the [001] direction. The resulting structure is termed $L1_0$ and corresponds to a superlattice 10 in the limit that each layer 12, 14 is a single atomic plane thick. An axis 26 perpendicular to atomic planes 22, 24 corresponds to the c-axis of $L1_0$ structure 20, and is parallel to the [001] direction. A pair of axes 28 are parallel to atomic planes 22, 24, and correspond to the a-axes of $L1_0$ structure 20. Thus, the $L1_0$ structure is uniaxial with the unique axis corresponding to c-axis 26. The magnetic moments of CoPt and FePt are preferentially aligned along this axis.

PtFe and CoPt are only two of a number of intermetallic compounds which may be assembled in a tetragonal $L1_0$ crystal structure. Like PtFe and CoPt, these other intermetallic compounds should exhibit pronounced uniaxial magnetic, optical, electronic, and mechanical properties due to the uniaxial $L1_0$ crystal structure. However, as indicated above, growing oriented thin films of intermetallic $L1_0$ structures has proven to be very difficult.

The present invention relies on coherent precipitation to produce thin films of uniaxial $L1_0$ intermetallic structures 20 from corresponding superlattices 10. Coherent precipitation refers to the tendency of certain atomic planes of precipitated material to align with those of the surrounding metal matrix during formation of the precipitate. The factors leading to preferential alignment can be understood with reference to FIGS. 2A, 2B, where there are shown schematic diagrams of two different orientations of a precipitate 38 relative to epitaxially or texturally related materials 30, 32. Precipitate 38 includes crystal planes 40, 42 having different lattice spacings 41, 43, respectively. Materials 30, 32 include crystal planes 34 and 36, respectively, which have approximately equal lattice spacings 35, 37. Interface 44 separates materials 30, 32; interfaces 46, 48 separate one orientation (I) of precipitate 38 from materials 30 and 32, respectively; and interfaces 50, 52 separate the second orientation (II) of precipitate 38 from materials 30, 32, respectively.

Figure 2A:
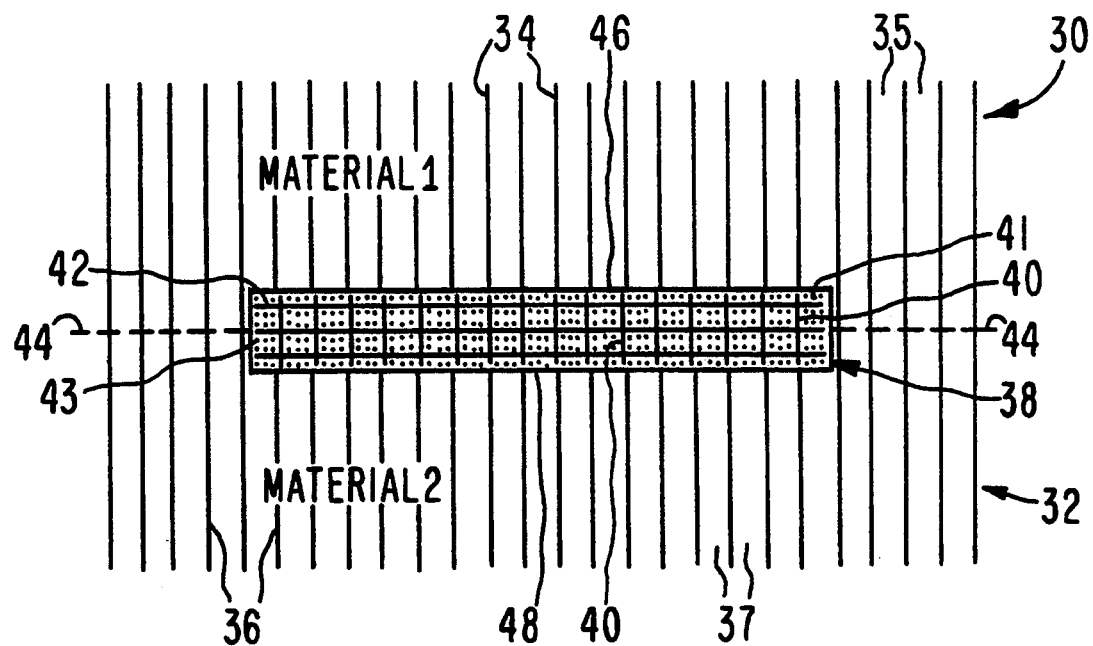
FIG. 2A is a schematic diagram showing one possible orientation of an intermetallic precipitate (38) formed at the interface (44) between two metallic crystals (30, 32).

In orientation I, depicted in FIG. 2A, precipitate 38 has crystal planes 40 aligned parallel to crystal planes 34, 36 of materials 30, 32, respectively. In this orientation, crystal planes 34, 36 are approximately aligned with crystal planes 40 of precipitate 38. The near match between the lattice spacings of precipitate 38 and those of materials 30, 32 stabilizes interfaces 46, 48, which are referred to as coherent interfaces.

Figure 2B:
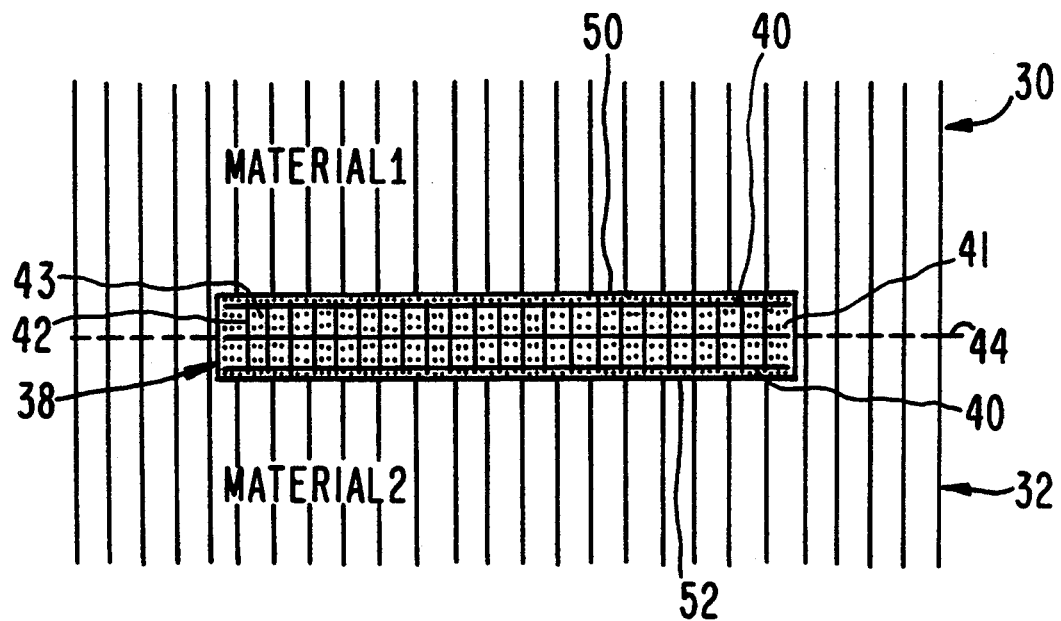
FIG. 2B is a schematic diagram showing a second possible orientation of an intermetallic precipitate (38) formed at the interface (44) between two metallic crystals (30, 32).

Referring now to orientation II of precipitate 38, as depicted in FIG. 2B, the alignment of crystal planes 42 with crystal planes 34, 36 is not as good as it is in orientation I. Interfaces 50, 52 are incoherent and consequently not as stable as interfaces 46, 48. Therefore, the relative stability of interfaces 46, 48 favors formation of precipitate 38 in orientation I. Coherent precipitation is thus driven by the energetic favorability of coherent interfaces over incoherent interfaces.

As an example of the orientational bias possible with the method of the present invention, consider the lattice parameters of body centered cubic (BCC) Fe, face centered cubic (FCC) Pt, and tetragonal ($L1_0$) PtFe. The (100) face of the BCC Fe lattice has a lattice spacing of 2.87 Angstroms. The (100) face of FCC Pt has a lattice spacing of 3.93 Angstroms which can be decomposed into a square net oriented at 45° with respect to the (100) face and having a lattice spacing of 2.77 Angstroms. For comparison, the lattice spacing of a similar square net at the c-face of $L1_0$ PtFe is 2.72 Angstroms and the lattice spacing of a net at the a-face is 2.68 Angstroms. The (100) face of BCC Fe and the square net oriented at 45° with respect to the (100) face of FCC Pt are better matched to the c-face of PtFe than to the a-face of PtFe. Thus, under conditions which allow precipitation of Pt and Fe atoms into an interface between the (100) faces of FCC Pt and BCC Fe crystals, respectively, there will be a strong orientation bias favoring formation of $L1_0$ PtFe having its c-face aligned with the (100) faces of the Pt and Fe crystals. This bias orients the c-axis [001] perpendicular to the interface.

The orientation bias described above is not limited o epitaxial superlattices. A similar orientation bias is operative in crystallographically textured superlattices. For example, the deposition of Fe on a textured substrate having a [001] alignment normal to the deposition plane yields thin films of Fe crystals having [001] alignment normal to the film plane and random orientation of BCC Fe crystals about the [001] direction within the plane of the thin film. Deposition of Pt on this crystallographically textured Fe film yields crystallographically textured Pt in a similar manner. At the interface between the Pt and Fe layers, however, Pt atomic planes parallel to the [001] direction will be locally aligned with those of the Fe crystals across the interface in the manner indicated for materials 30, 32 in FIG. 2. This local alignment of atomic planes normal to the interface allows coherent precipitation to operate locally in the manner described above.

In one embodiment of the present invention, MgO is used as a substrate 16 with [001] crystal direction oriented perpendicular to the deposition surface as shown in FIG. 1. Twenty three Angstroms of Fe are deposited by sputtering onto the (100) face of MgO at 100° C. A layer of Pt, approximately 29.5 Angstroms thick, is then deposited onto the Fe layers by sputtering at 100° C. The process is then repeated until eight similar bilayers of Fe/Pt have been deposited. To facilitate deposition at lower temperatures, an underlayer of Pt may be deposited on the MgO prior to deposition of the Fe and Pt superlattice layers. The structure and orientation of the resulting superlattice is determined by X-ray diffraction.

Figure 3:
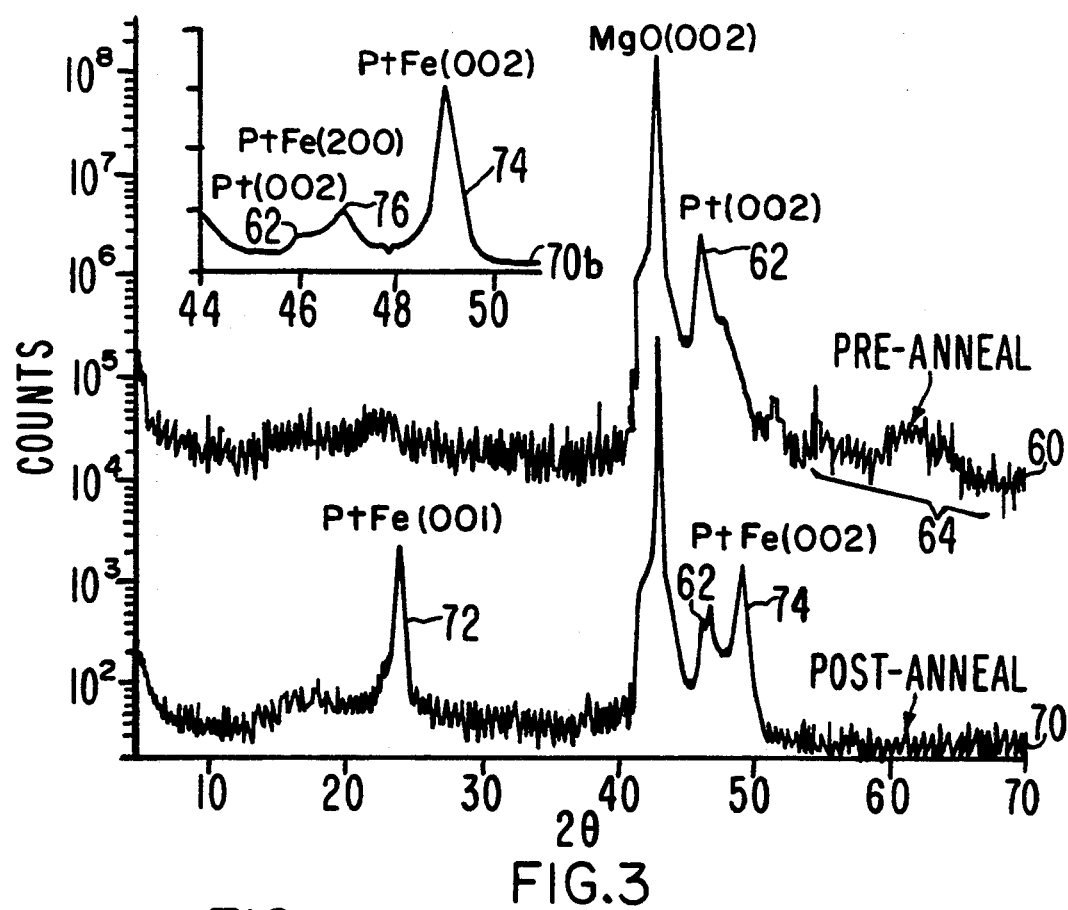
FIG. 3 shows X-ray scans (60, 70) of an artificial PtFe superlattice (10) before and after annealing, respectively.

Referring to FIG. 3, there are shown X-ray scans 60, 70 of a superlattice 10 produced in the manner described above. Upper scan 60, taken prior to annealing the superlattice 10, exhibits a peak 62 at approximately 46° which corresponds to the (002) reflection of the Pt underlayer. Large angle peaks 64 between 50° and 65° correspond to reflections from superlattice layers 12, 14; their location depends on the modulation wavelength of superlattice layers 12, 14. No peaks corresponding to PtFe are visible in the upper scan 60.

The artificial superlattice 10 is then annealed to allow coherent precipitation of Pt and Fe from deposited layers 12, 14 at interfaces 44 between Fe layer 12 and Pt layer 14. Annealing may be done by placing the superlattice sample in a vacuum chamber, reducing the pressure to between $1 \times 10^{-6}$ Torr and $1 \times 10^{-7}$ Torr, and heating the sample to between 450° C. and 500° C. for between 12 and 16 hours. Alternatively, the sample may be annealed by laser heating, by heating in an inert ambient, or by rapid thermal annealing.

Referring to lower curve 70 in FIG. 3, there is shown a post anneal x-ray scan exhibiting a new peak 72 at approximately 24° which corresponds to the (001) reflection of PtFe, and a second new peak 74 at approximately 49° which corresponds to the (002) reflection of PtFe. Referring now to the inset scan 70b of FIG. 3, there is shown a detailed view of scan 70 between 44° and 50°, which reveals a new peak 76 in addition to peaks 62, 74. Peaks 62, 74, 76 correspond to Pt(002), PtFe(002), and PtFe(200) reflections, respectively. Peak 74 originates from crystals having the desired orientation with the [001] direction, i.e. the c-axis, aligned perpendicular to lattice interface 44, while peak 72 corresponds to PtFe crystals having their [001] axis oriented parallel to the lattice interface 44.

Figure 4:
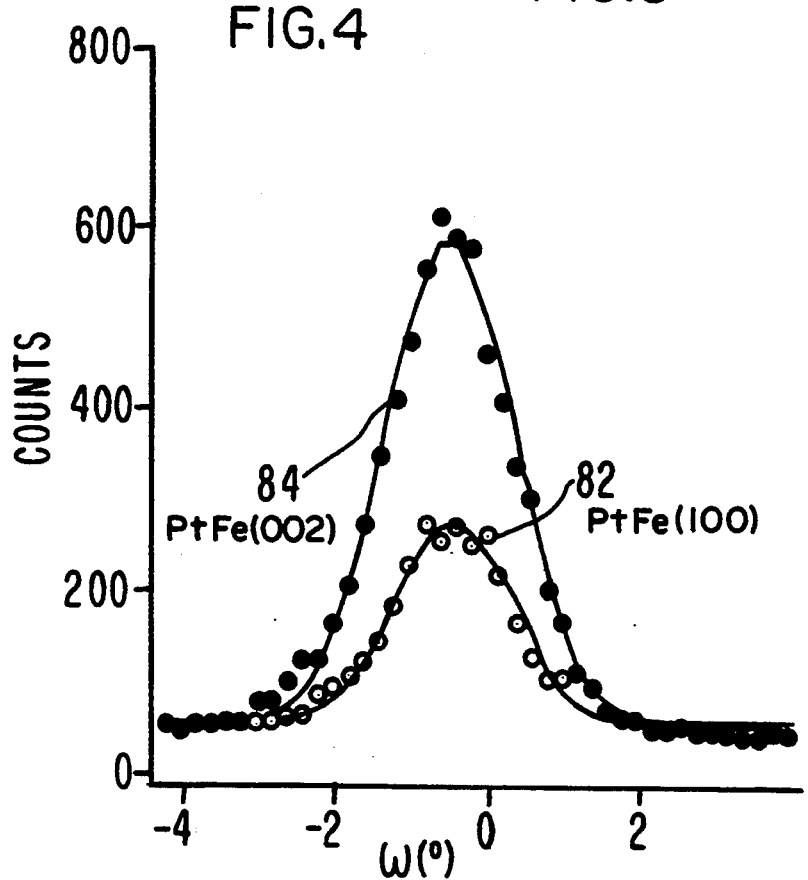
FIG. 4 shows two graph of scattered X-ray intensity versus the angle of incidence of the X-ray beam with respect to the surface, for the PtFe(002) (84) and PtFe(200) (82) peaks, respectively.

There are shown in FIG. 4 rocking curves 82, 84 for peak 72 and peak 74, respectively, where w is the angle away from the surface normal. The full widths at half maximum for curves 82, 84 are substantially equal, indicating that the intensity of peaks 72, 74 in FIG. 3 reflects a true difference in the orientation preference for the [001] direction perpendicular to the lattice planes, amounting to a three to one ratio.

Figure 5A:
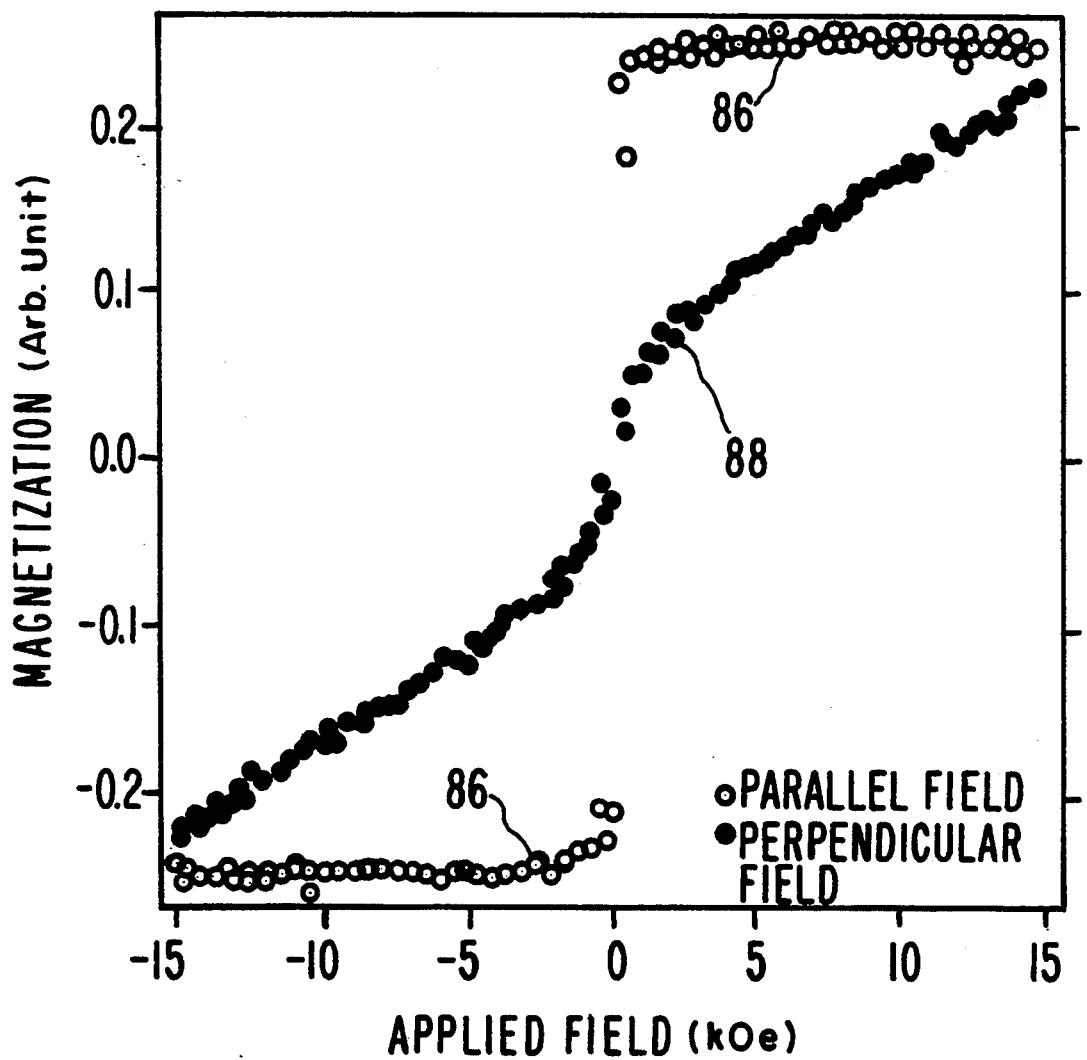
FIG. 5A is a graph of magnetization parallel and perpendicular to the plane of the PtFe superlattice (10) versus applied field before annealing.
Figure 5B:
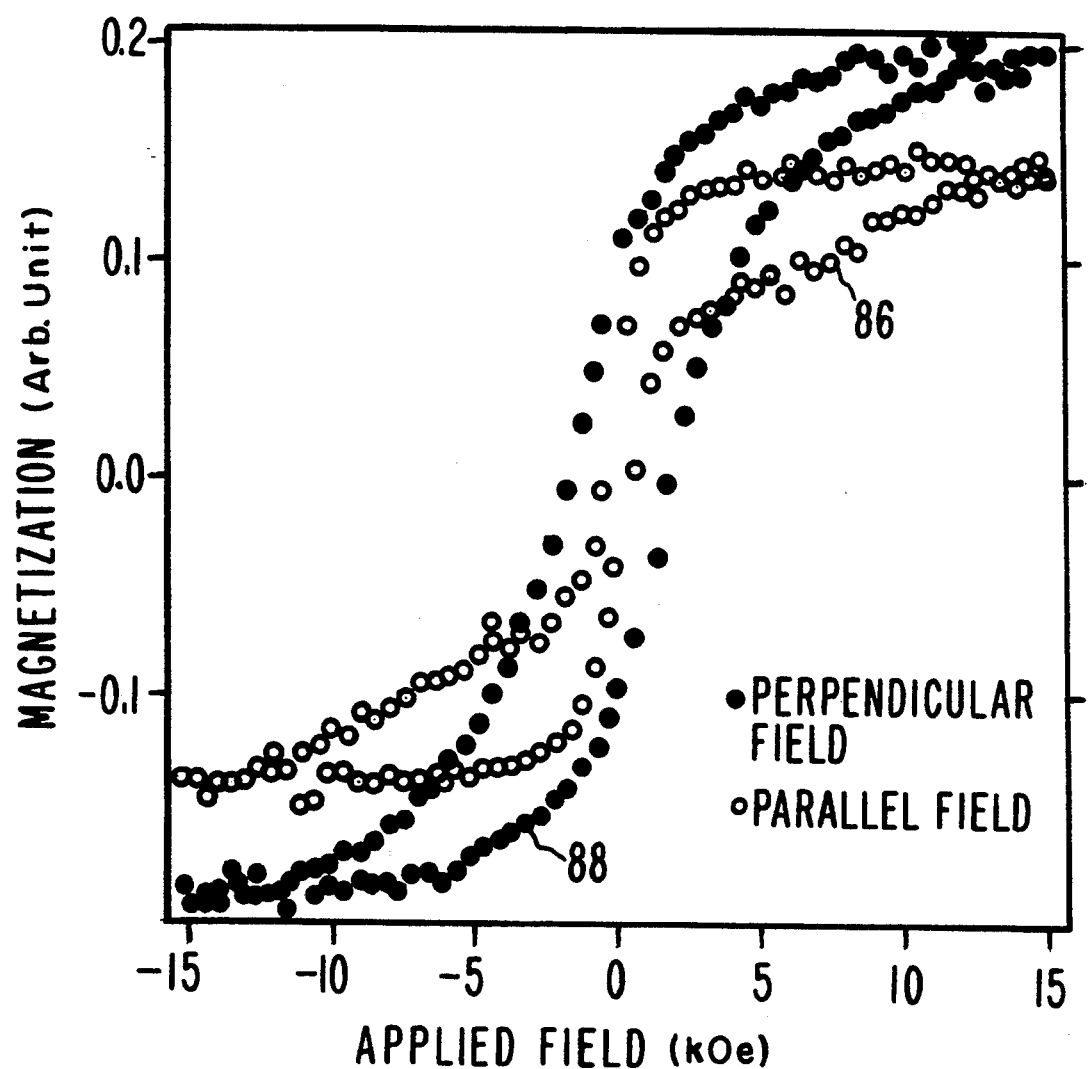
FIG. 5B is a graph of magnetization parallel and perpendicular to the plane of the PtFe superlattice (10) versus applied field after annealing.

Referring now to FIG. 5A, there are shown magnetic hysteresis loops 86, 88 corresponding to in-plane and out-of-plane magnetizations, respectively, as a function of applied magnetic field strength, for the Pt/Fe superlattice prior to annealing. As can be seen from curves 86 and 88, the sample is much more easily magnetized in the plane of the sample than out of the plane of the sample. FIG. 5B shows magnetic hysteresis loops 86, 88 corresponding to in-plane and out-of-plane magnetization, respectively, for the PtFe superlattice following annealing. As can be seen, thin films of c-oriented $L1_0$ PtFe generated by annealing are substantially easier to magnetize out-of-plane than in-plane. Further, the magnetization becomes hysteretic, exhibiting a coercivity of 1.0 kOe for the out-of-plane component 86. Magnetic torque measurements on the annealed sample were taken at up to 22.6 kOe. The measured anisotropy constant, $K_u$, of the sample is $8 \times 10^6$ ergs/cc. This represents a lower limit on the anisotropy of the magnetization, since the sample was not saturated at 22.6 kOe.

In an alternative embodiment of the present invention, an artificial superlattice 10 is assembled by deposition of Pt and Co on single crystal or textured MgO having its [001] direction aligned perpendicular to the deposition surface. As in the case of Pt/Fe superlattices, an underlayer of Pt deposited on the MgO facilitates low temperature deposition of the Pt and Co superlattice layers. Thirty two bilayers, each comprising fifteen Angstroms of Pt and thirteen Angstroms of Co, are deposited on the MgO substrate at 100° C. by sputtering. The resulting superlattice structure has the Pt(001) axis oriented out of the plane of the sample. Following x-ray and magnetic measurements, the superlattice is annealed at a temperature of between 650° C. and 700° C. in a vacuum of between $1 \times 10^{-7}$ Torr and $1 \times 10^{-6}$ Torr for between 12 and 16 hours.

Figure 6A:
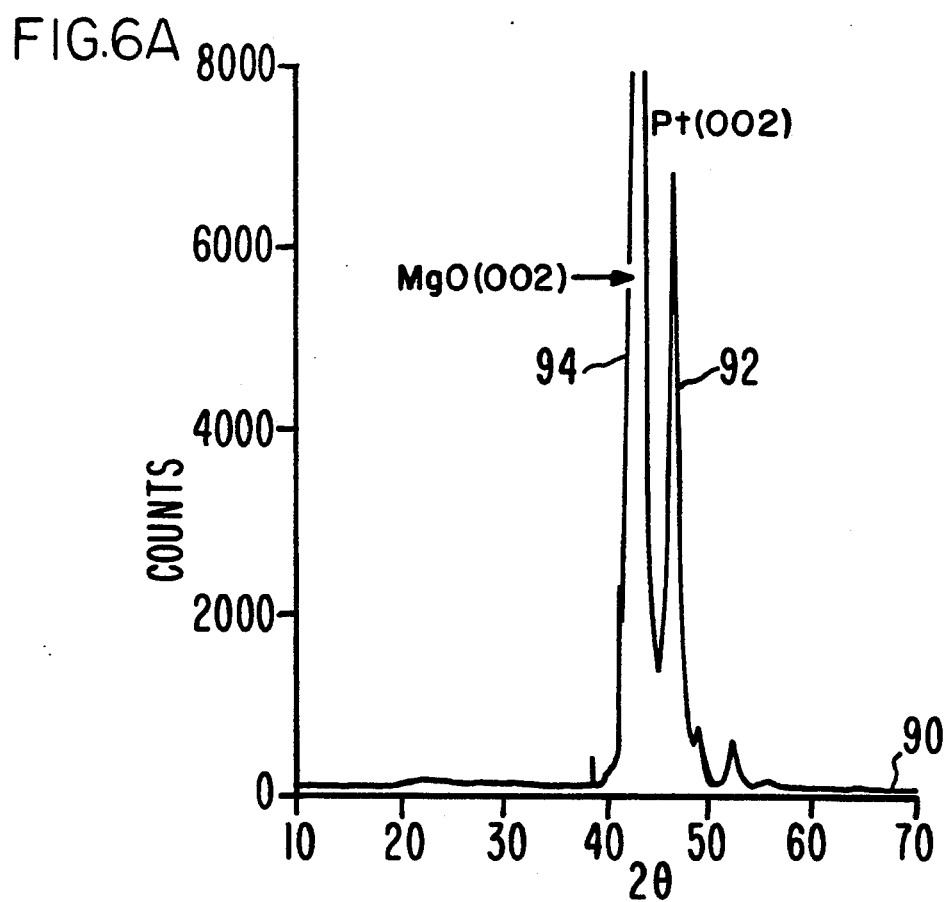
FIG. 6A shows an X-ray scan of an artificial CoPt superlattice (10) before annealing.
Figure 6B:
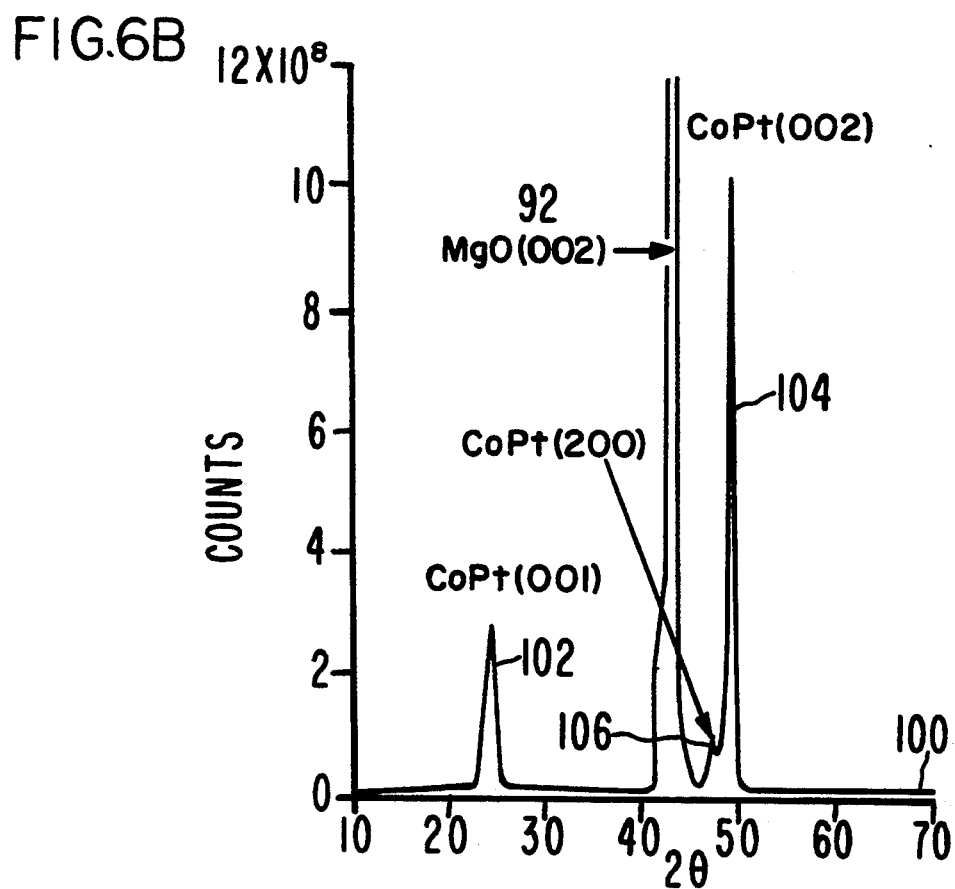
FIG. 6B shows an X-ray scan of an artificial CoPt superlattice (10) after annealing.

Referring to FIG. 6A, there is shown an x-ray scan 90 of the CoPt superlattice prior to annealing. Scan 90 exhibits peaks 92, 94 corresponding to the Pt(002) reflection of the underlayer and MgO(002) reflection, respectively. No peaks corresponding to CoPt are visible in scan 90. FIG. 6B shows an x-ray scan 100 of the CoPt superlattice 10 following annealing. In addition to peak 92, scan 100 exhibits peaks 102, 104, 106, corresponding to the CoPt(001), CoPt(002), and CoPt(200) reflections, respectively, of a CoPt $L1_0$ structure 20. The relative intensity of peaks 104, 106 indicates that the $L1_0$ CoPt is aligned predominantly with the [001] direction perpendicular to the superlattice layers 12, 14.

Figure 7A:
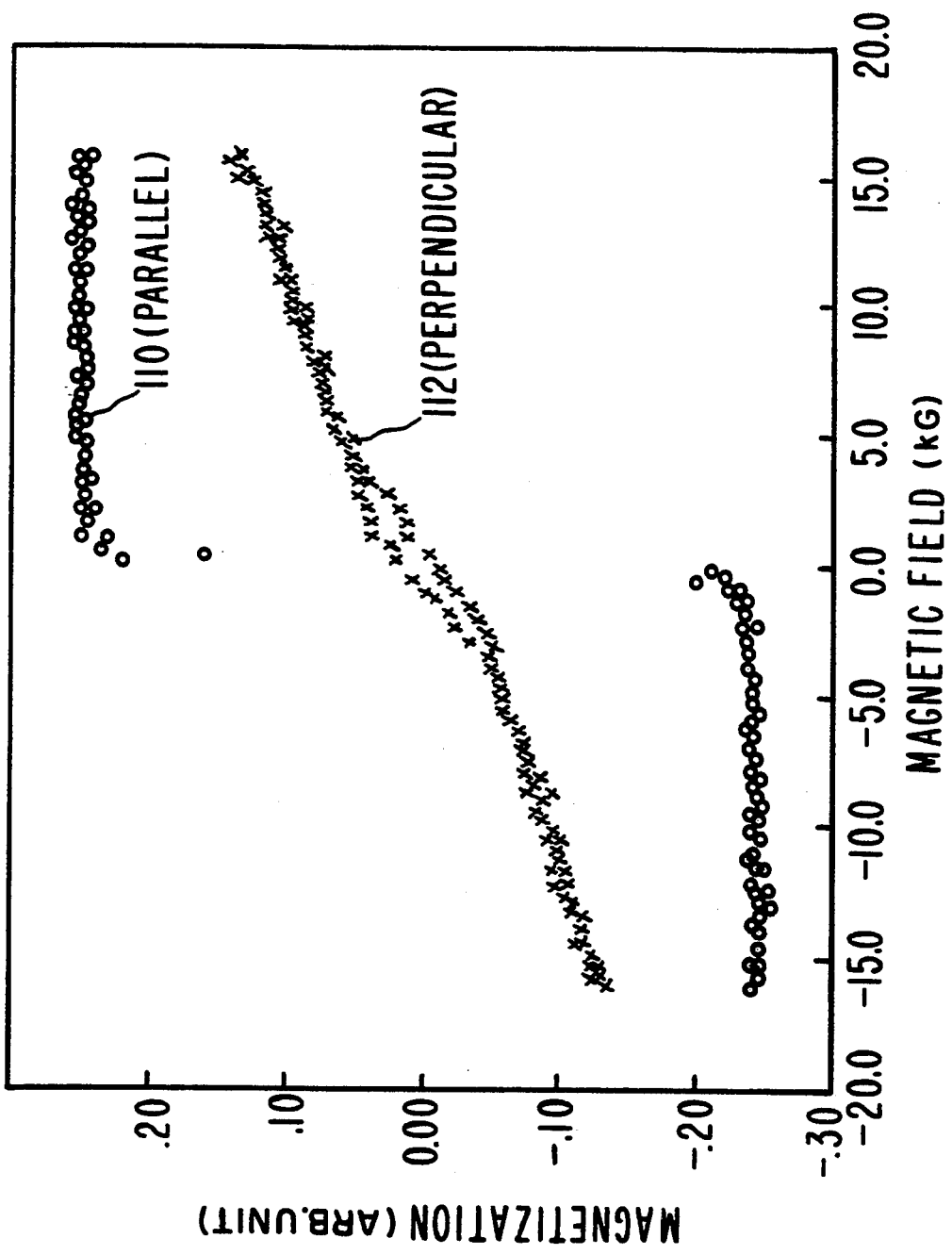
FIG. 7A is a graph of magnetization parallel and perpendicular to the plane of the CoPt superlattice (10) before annealing.
Figure 7B:
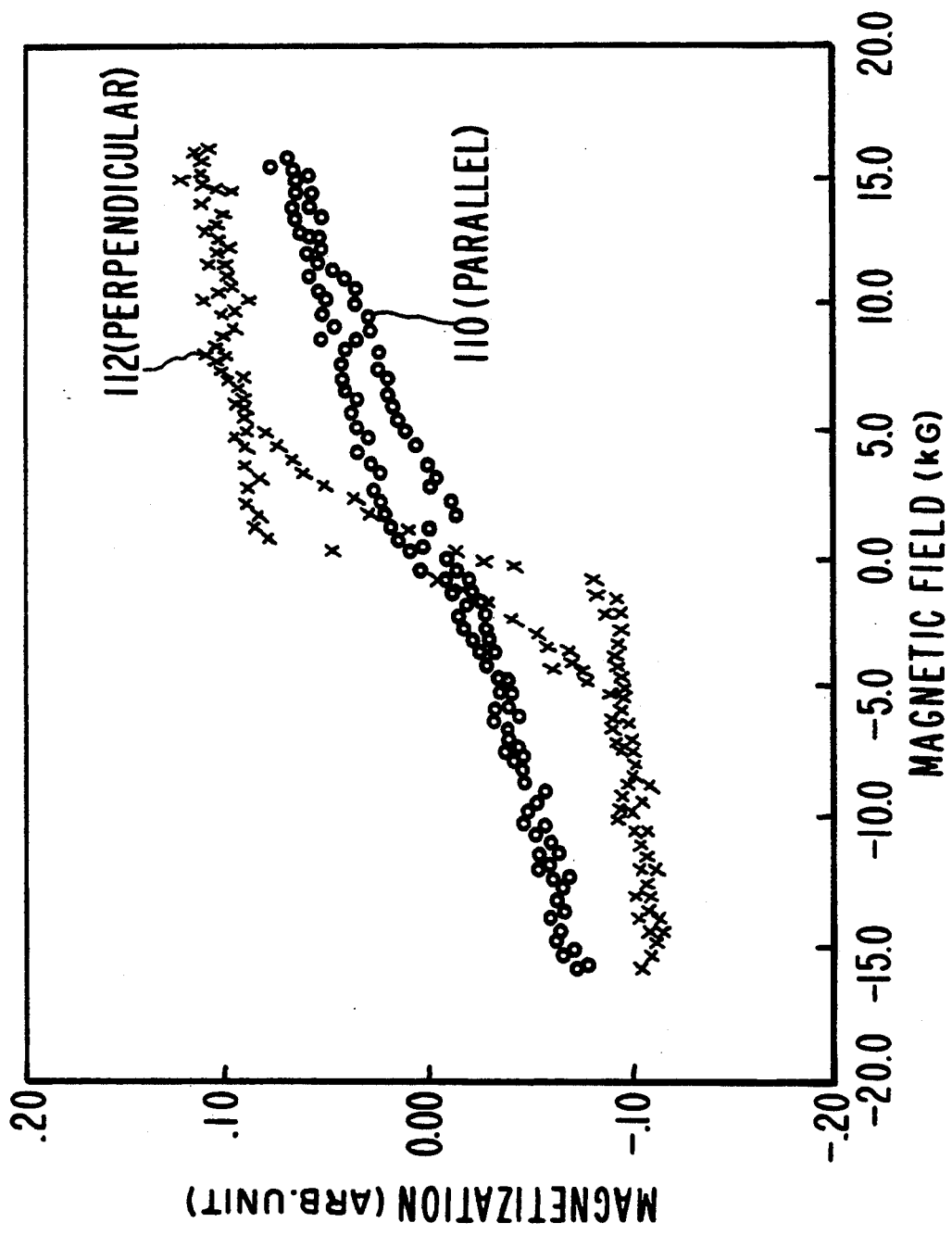
FIG. 7B is a graph of magnetization parallel and perpendicular to the plane of the CoPt superlattice (10) after annealing.

Referring to FIG. 7, there are shown hysteresis loops 110, 112 for in-plane and out-of-plane magnetization measurements, respectively. Prior to annealing, curves 110, 112 of FIG. 7A indicate that in-plane magnetization 110 is far easier to achieve than out-of-plane magnetization 112. However, following annealing, during which $L1_0$ CoPt is coherently precipitated at the Pt/Co interfaces of the superlattice, curves 110, 112 of FIG. 7B indicate that out-of-plane magnetization 112 of $L1_0$ CoPt is easier to achieve than in-plane magnetization 110.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A method for making oriented thin films of an intermetallic compound having generally uniaxial magnetic, optical, electronic, and mechanical properties, the method comprising the steps of:

selecting a substrate material having an alignment suitable for biasing the orientation of deposited materials;

depositing a plurality of layers of a first metal having a first crystal structure onto the substrate material;

depositing a plurality of layers of a second metal on top of the plurality of layers of the first metal, to form an interface between the first and second metals, the second metal having a second crystal structure such that an intermetallic compound formed by combining the first and second metals has a preferred orientation with respect to the interface;

repeating the deposition of alternating pluralities of layers of first and second metals a selected number of times to produce a plurality of interfaces; and annealing the deposited layers to coherently precipitate an oriented thin film of the intermetallic compound formed from the combined first and second metals at each of the interfaces between the pluralities of first and second metal layers.

2. The method of claim 1, wherein the substrate material is a textured polycrystalline or amorphous material.

3. The method of claim 1, wherein the substrate material is a single crystal material.

4. The method of claim 3, wherein the single crystal material is MgO.

5. The method of claim 1, wherein the coherent precipitate of the combined first and second metals has an $L1_0$ crystal structure having its c-axis aligned perpendicular to the plane of the thin film.

6. The method of claim 5, wherein the first and second plurality of layers are deposited epitaxially.

7. The method of claim 6, wherein the first and second metals are Fe and Pt, respectively.

8. The method of claim 7, wherein the total thickness of the plurality of Fe layers is approximately 23 Angstroms and the total thickness of the plurality of Pt layers is approximately 29.5 Angstroms.

9. The oriented thin film of $L1_0$ PtFe having its c-axis aligned perpendicular to the plane of the thin film, produced by the method of claim 7.

10. A method for making oriented thin films of an intermetallic compound having generally uniaxial magnetic, optical, electronic, and mechanical properties, the method comprising the steps of:

selecting a substrate material having an alignment suitable for biasing the orientation of deposited materials;

depositing alternating pluralities of layers of first and second metals onto the substrate material, to form a plurality of interfaces between the first and second metals, the first and second metals having first and second crystal structures, respectively, such that an intermetallic compound formed by combining the first and second metals has a preferred orientation with respect to the plurality of interfaces; and annealing the deposited layers to coherently precipitate an oriented thin film of the intermetallic compound formed from the combined first and second metals at each of the plurality of interfaces between the pluralities of first and second metal layers.

11. The method of claim 10, wherein the coherent precipitate of the combined first and second metals has an $L1_0$ crystal structure having its c-axis oriented perpendicular to the plane of the thin film.

12. The method of claim 11 wherein the first and second metals are Co and Pt, respectively.

13. The method of claim 12, wherein the total thickness of the plurality of Co layers is approximately 13 Angstroms and the total thickness of the plurality of Pt layers is approximately 15 Angstroms.

14. The oriented thin film of $L1_0$ PtCo having its c-axis aligned perpendicular to the plane of the thin film, produced by the method of claim 12.

15. The method of claim 1, wherein the first and second metals are selected from the group of metal pairs consisting of Fe—Ni, Fe—Pd, Ni—Pd, Ni—Pt, Pd—Co, Co—Ni, Cu—Au, Pt—Co and Cr—Pd.

16. The method of claim 1, wherein annealing the sample comprises the substeps of: subjecting the sample to reduced pressures of between $1 \times 10^{-6}$ Torr and $1 \times 10^{-7}$ Torr;

heating the sample to between 450° C. and 675° C.; and maintaining the sample at the elevated temperature for between 12 hours and 16 hours.

17. The method of claim 1, wherein the annealing step comprises subjecting the sample to laser heating.

18. The method of claim 1, wherein the annealing step comprises subjecting the sample to rapid thermal annealing.

19. The method of claim 1, wherein the annealing step comprises heating the sample in an inert gas ambient.

20. The method of claim 1, wherein the first and second metals are first and second alloys.

21. The method of claim 1, wherein an underlayer of Pt is deposited on the substrate prior to deposition of the plurality of layers of the first metal, to allow deposition of the first and second metals at lower temperatures.

* * * * *